United States Patent
Tang et al.

(10) Patent No.: US 7,488,651 B2
(45) Date of Patent: Feb. 10, 2009

(54) METHOD OF MAKING VERTICAL TRANSISTOR STRUCTURES HAVING VERTICAL-SURROUNDING-GATES WITH SELF-ALIGNED FEATURES

(75) Inventors: Sanh D. Tang, Boise, ID (US); Grant S. Huglin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 165 days.

(21) Appl. No.: 11/495,473

(22) Filed: Jul. 28, 2006

(65) Prior Publication Data
US 2007/0020819 A1    Jan. 25, 2007

Related U.S. Application Data

(62) Division of application No. 10/928,522, filed on Aug. 26, 2004, now Pat. No. 7,242,057.

(51) Int. Cl.
H01L 21/336    (2006.01)

(52) U.S. Cl. ............... 438/268; 257/329; 257/401; 257/E29.262; 257/E21.41; 438/156

(58) Field of Classification Search ........... 257/328, 257/E27.096, E29.262, E29.313, E21.383, 257/E21.41, E27.091, E21.652, 329, 401; 438/137, 138, 156, 173, 192, 206, 209, 212, 438/268
See application file for complete search history.

(56) References Cited

U.S. PATENT DOCUMENTS

| | | | | |
|---|---|---|---|---|
| 5,414,289 A | * | 5/1995 | Fitch et al. | 257/329 |
| 5,780,888 A | * | 7/1998 | Maeda et al. | 257/302 |
| 6,740,919 B2 | * | 5/2004 | Piazza et al. | 257/301 |
| 6,884,676 B2 | * | 4/2005 | Arnold et al. | 438/243 |
| 7,348,628 B2 | * | 3/2008 | Yoon et al. | 257/328 |
| 7,368,352 B2 | * | 5/2008 | Kim et al. | 438/268 |
| 2002/0074585 A1 | * | 6/2002 | Tsang et al. | 257/302 |
| 2006/0030106 A1 | * | 2/2006 | Beintner | 438/268 |
| 2007/0082448 A1 | * | 4/2007 | Kim et al. | 438/268 |
| 2008/0124869 A1 | * | 5/2008 | Yoon et al. | 438/268 |

* cited by examiner

*Primary Examiner*—Lex Malsawma
*Assistant Examiner*—William F Kraig

(57) ABSTRACT

The present inventions include a vertical transistor formed by defining a channel length of the vertical-surrounding-gate field effect transistor with self-aligning features. The method provides process steps to define the transistor channel length and recess silicon pillars used to form the vertical-surrounding gate field effect transistor structure for use in the manufacture of semiconductor devices.

47 Claims, 12 Drawing Sheets

METHOD OF MAKING VERTICAL TRANSISTOR STRUCTURES HAVING VERTICAL-SURROUNDING-GATES WITH SELF-ALIGNED FEATURES

This application is a divisional to U.S. patent application Ser. No. 10/928,522, filed Aug. 26, 2004 now U.S. Pat. No. 7,242,057.

FIELD OF THE INVENTION

This invention relates to semiconductor fabrication processing and, more particularly, to a method for forming a vertical-surrounding-gate field effect transistor for semiconductor devices, such as dynamic random access memories (DRAMs).

BACKGROUND OF THE INVENTION

The continuing trend of scaling down integrated circuits has motivated the semiconductor industry to consider new techniques for fabricating precise components at sub-micron levels. As is the case for most semiconductor integrated circuitry, circuit density is continuing to increase at a fairly constant rate and a major makeup of many integrated circuits is the field effect transistor (FET). The typical FET structure is formed in a silicon substrate, with the source/drain implanted into the horizontal substrate surface, the channel spanning there between and the gate formed over the channel. A second FET structure is a vertical oriented transistor, such as a vertical-sided-gate field effect transistor (VSGFET).

The VSGFET structure is oriented such that the source/drain and channel of the transistor are formed vertically in a silicon substrate by forming vertical silicon pillars in the silicon substrate, while the gate wraps around the channel region of the vertical pillars. A key aspect in forming the VSGFET is in the definition of the gate length. One fabrication approach to define the gate length of a VSGFET is depicted in FIG. 1-5.

The overhead view of FIG. 1 shows a series of circular nitride hard masks 11 defining columns of vertical silicon pillars separated by shallow trench isolation 12. A cross-section taken through line 1-1' of FIG. 1 is depicted in FIG. 2. As seen in FIG. 2, the vertical silicon pillars 20 are formed by etching into the silicon substrate 10 by using the nitride hard mask 11 as an etching guide. Shallow trench isolation 12 is formed between each column of silicon pillars.

As shown in FIG. 3, a conformal gate dielectric 30 is formed on the substrate surface such that it coats the horizontal surface of silicon substrate 10, the shallow trench isolation 12, the vertical sidewalls of the silicon pillars 20 and the nitride hard mask 11.

As shown in FIG. 4, a polysilicon 40 is deposited to fill the spaces between the silicon pillars 20. Then the polysilicon 40 is planarized along with a top portion of the nitride hard mask 11.

As shown in FIG. 5, the polysilicon 40 is recessed to a designed thickness, which will expose an upper portion of the gate dielectric 30 as well as define the gate channel length of the vertical gated transistor. This approach has two main potential problems in that the recessing of polysilicon 40, typically by a plasma etch, has the tendency to damage the gate dielectric/polysilicon interface and the plasma etch causes unavoidable round corners 50 above the major horizontal surface of the vertical-surrounding-gate at the gate dielectric/polysilicon interface. These rounded corners 50 will increase gate channel length variation across the silicon substrate 10. Furthermore any misalignment between the gate polysilicon pattern and the silicon pillar 20 will increase the serial resistance of each transistor structure along with potential gate damage due to exposing the silicon channel.

The present invention describes a vertical-surrounding gate field effect transistor formed by a method to define a gate channel length for a vertical-surrounding gate field effect transistor with self-aligning features that addresses the above challenges, the method disclosed herein for use in the manufacture of semiconductor devices or assemblies, which will become apparent to those skilled in the art from the following disclosure.

SUMMARY OF THE INVENTION

Exemplary implementations of the present invention include a vertical transistor and a method to form a vertical transistor that defines a gate length for the vertical-surrounding gate field effect transistor with self-aligning features. The method provides process steps to define the transistor channel length and recess silicon pillars used to form the vertical-surrounding gate field effect transistor structure for use in the manufacture of semiconductor devices.

DETAILED DESCRIPTION OF THE INVENTION

In the following description, the terms "wafer" and "substrate" are to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in or over the base semiconductor structure or foundation. In addition, the semiconductor need not be silicon-based, but could be based on silicon-germanium, silicon-on-insulator, silicon-on-saphire, germanium, or gallium arsenide, among others. Embodiments of the present invention provide disclose a vertical-surrounding-gate field effect transistor and a method of forming a vertical-surrounding-gate field effect transistor (VSGFET) for semiconductor assemblies.

Exemplary implementations of the present invention are directed to a vertical-surrounding-gate field effect transistor and the processes for forming a surrounding-gate field effect transistor in a semiconductor device, as depicted in the embodiments of FIGS. 6-21.

Figure 1:
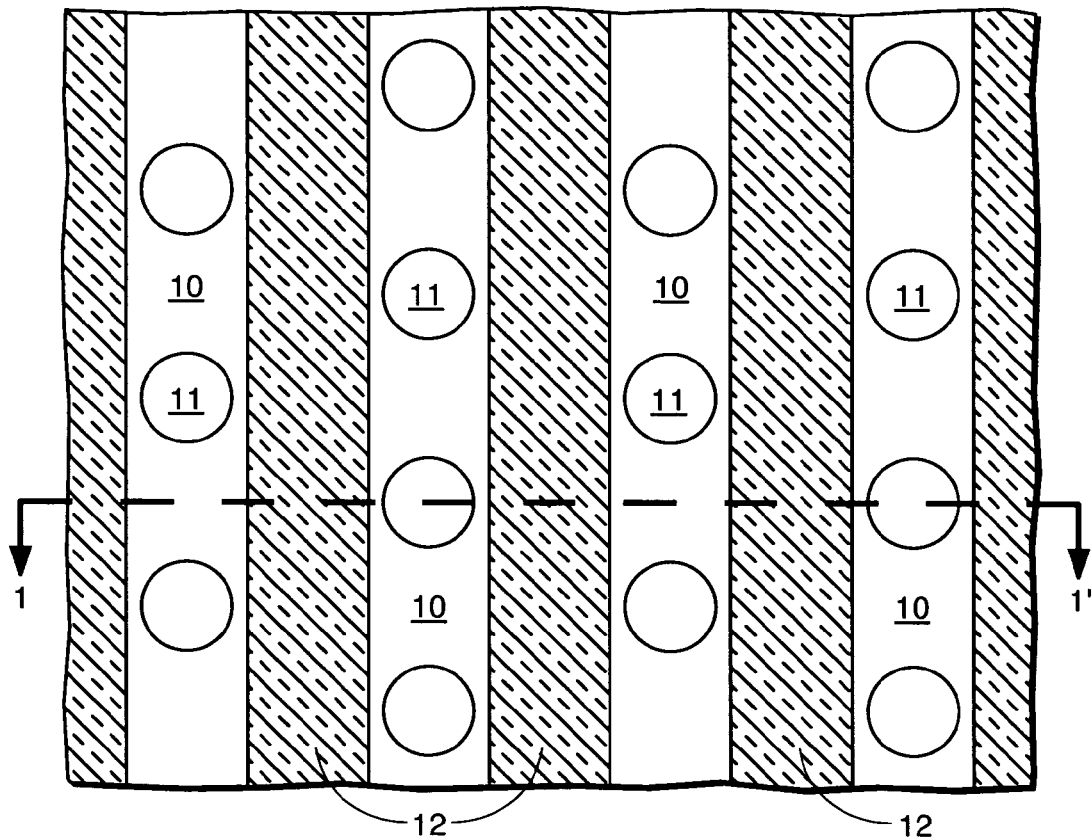
FIG. 1 is top-down view of a pattern of silicon pillars from a prior art method to define vertical-surrounding-gate field effect transistor.
Figure 2:
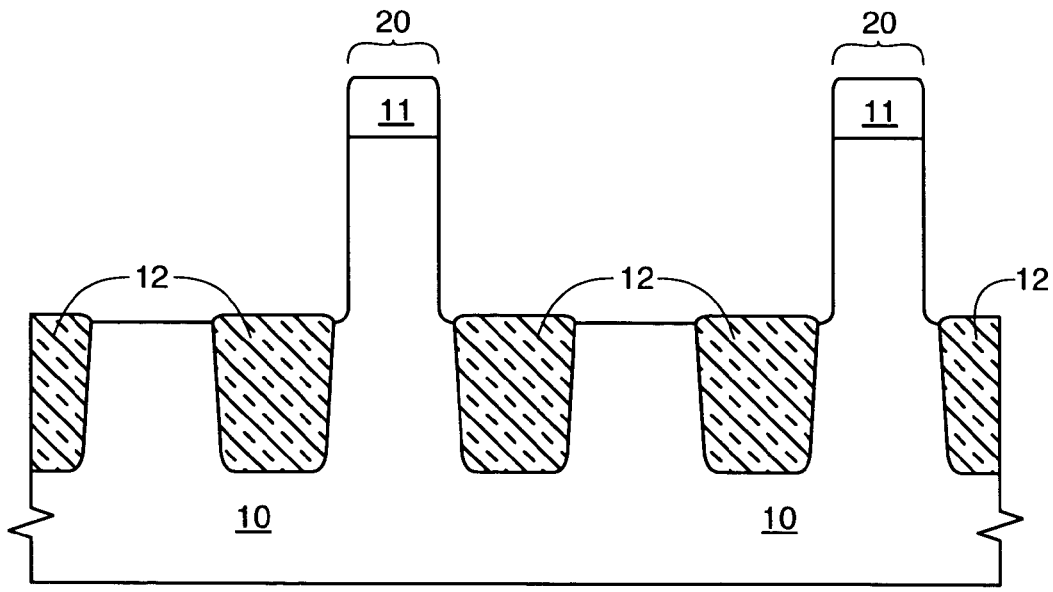
FIG. 2 is a cross-sectional view taken through line 1-1' of FIG. 1 showing a semiconductor substrate section depicting vertical silicon pillars topped by nitride hard mask and separated by shallow trench isolation.
Figure 3:
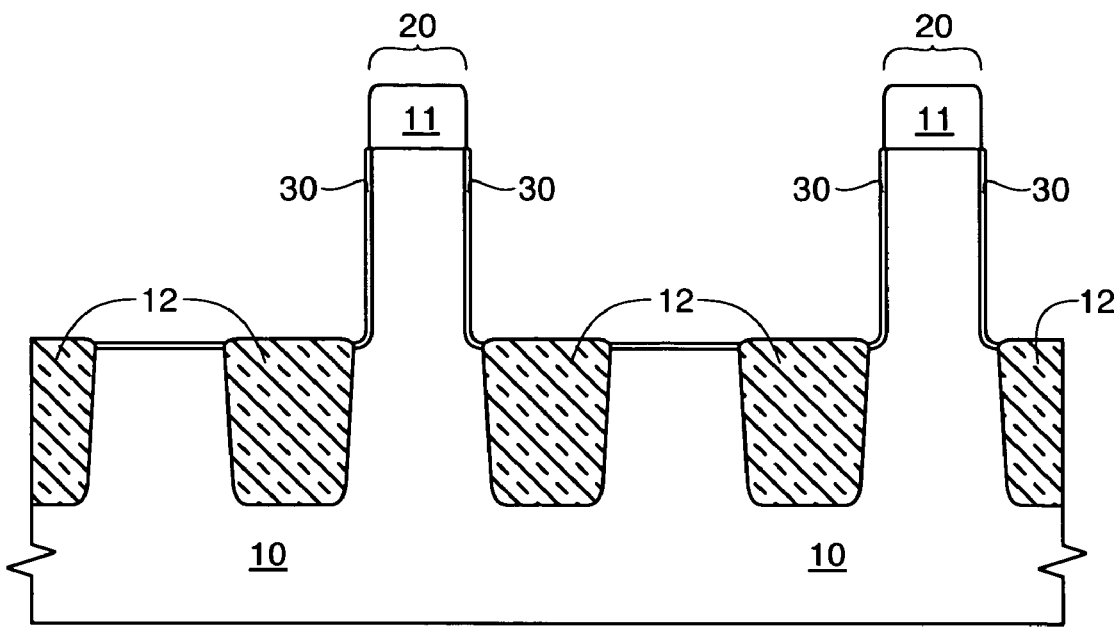
FIG. 3 is a subsequent cross-sectional view taken from FIG. 2 following the formation of a conformal gate dielectric layer over the silicon substrate assembly.
Figure 4:
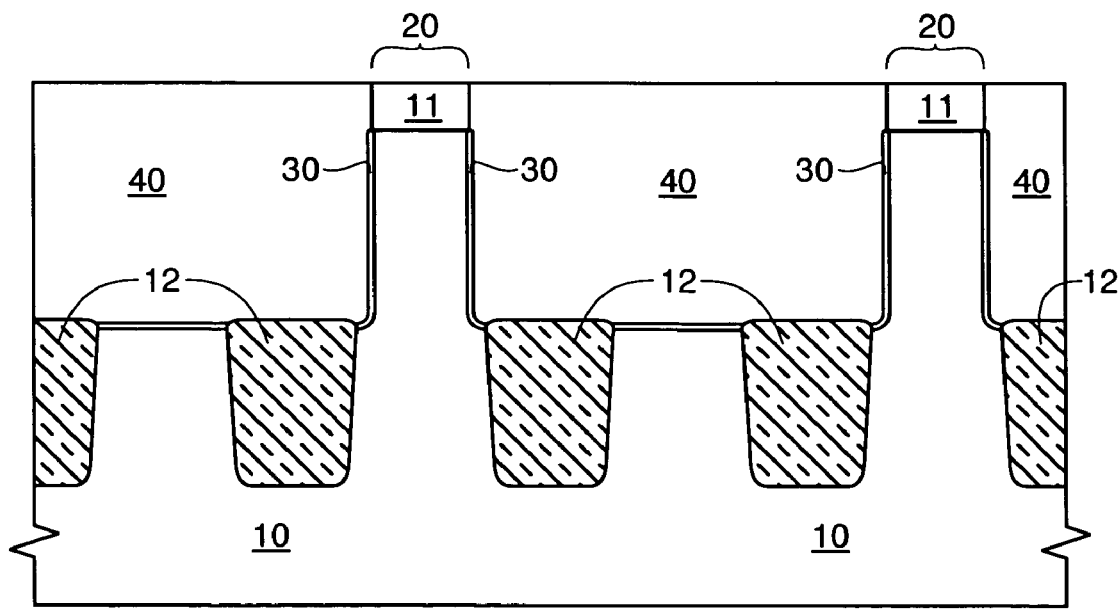
FIG. 4 is a cross-sectional view taken from FIG. 3 following the formation of a planarized polysilicon material between the silicon pillars.
Figure 5:
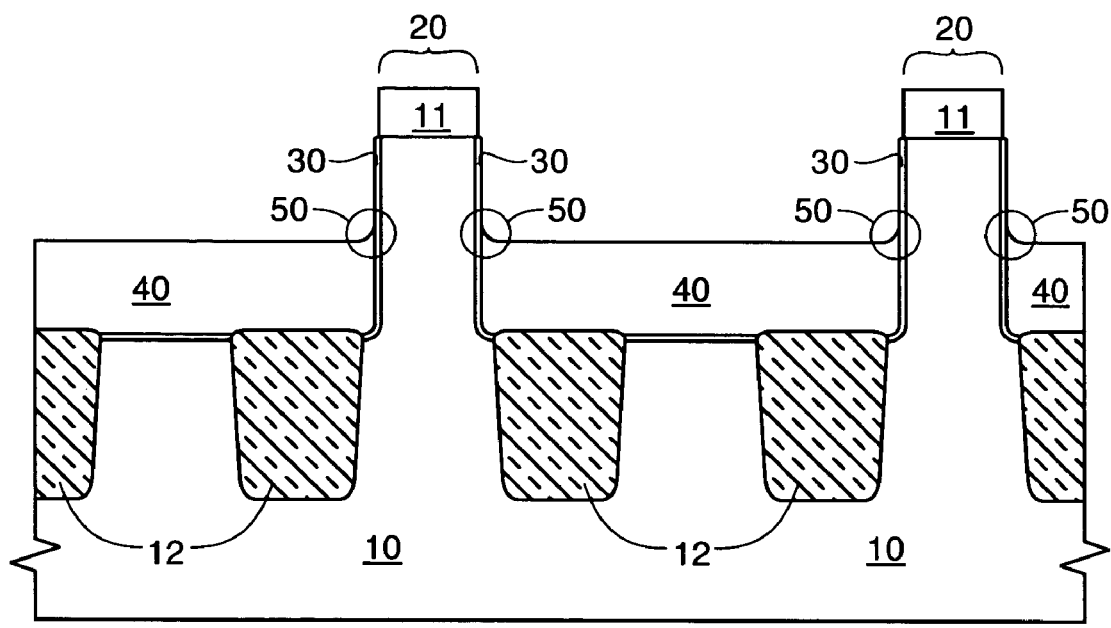
FIG. 5 is a cross-sectional view taken from FIG. 4 following the recessing of the polysilicon material to define the length of the vertical-surrounding-gate for a field effect transistor.
Figure 6:
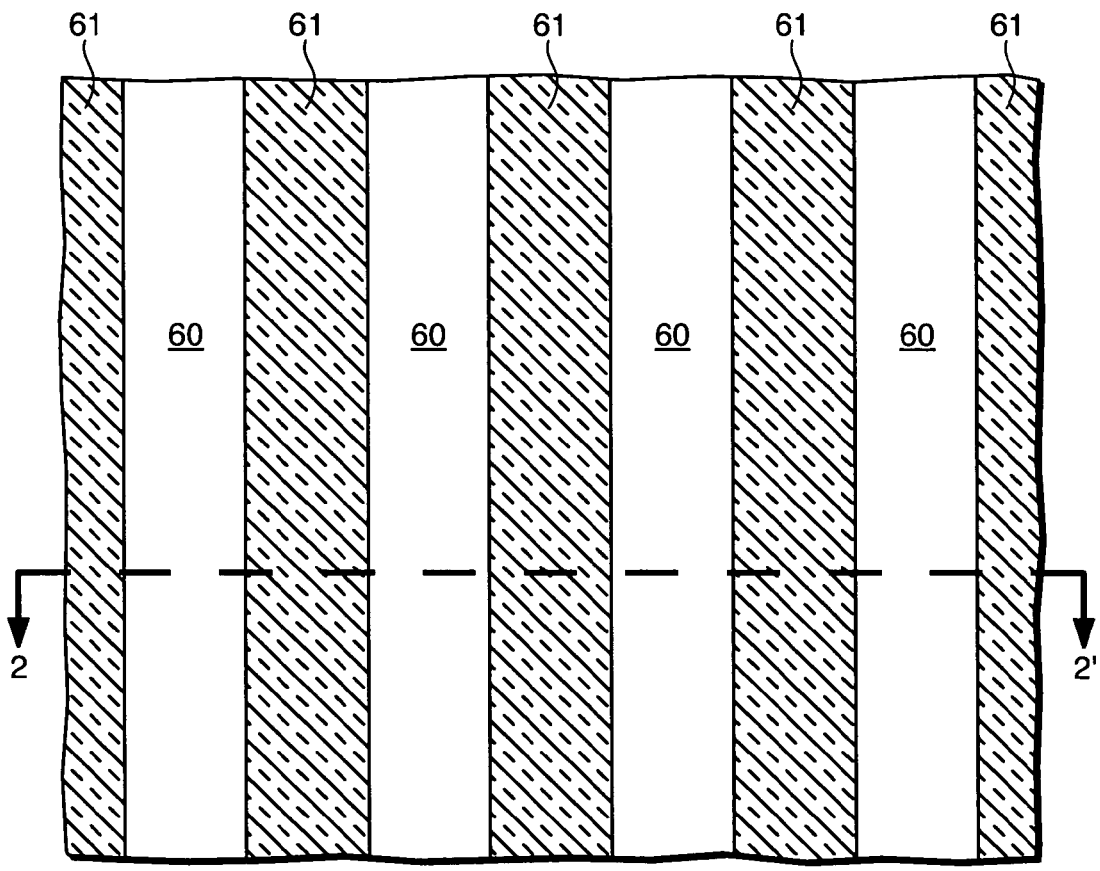
FIG. 6 depicts an embodiment of the present invention showing a top-down view of a silicon substrate section having columns of shallow trench isolation formed therein.

FIG. 6 depicts an embodiment of the present invention showing the beginning stage of the process in a top-down view of a silicon substrate section 60 having columns of shallow trench isolation 61 formed therein by conventional process steps.

Figure 7:
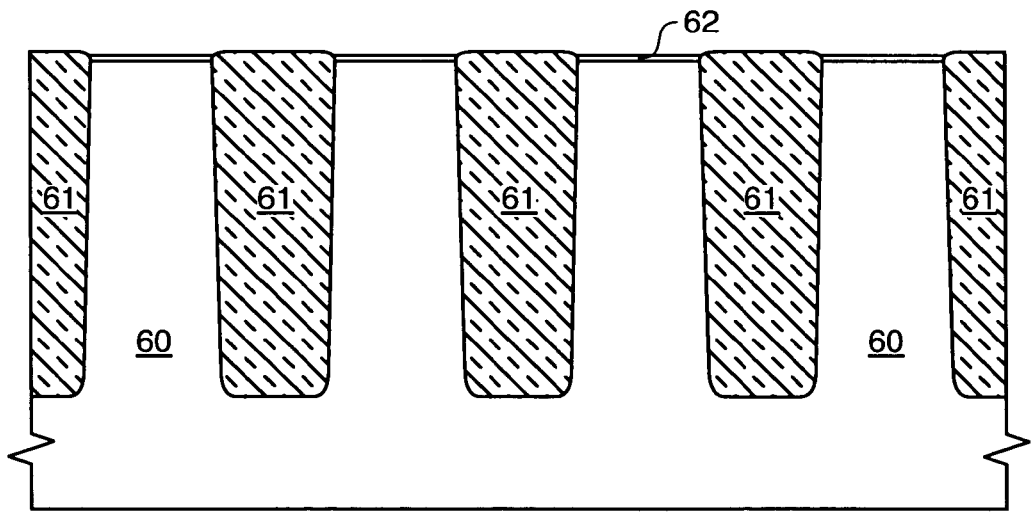
FIG. 7 is a cross-sectional view taken through line 2-2' of FIG. 6 showing the cross-section of the silicon substrate section having the columns of shallow trench isolation formed therein.

FIG. 7 is a cross-sectional view taken through line 2-2' of FIG. 6 showing the cross-section of silicon substrate section 60 having columns of shallow trench isolation 61 formed therein and an remaining layer of pad oxide overlying the silicon substrate section 60 between shallow trench isolation 61. As stated, conventional process steps know to one of ordinary skill in the art can be used to form the shallow trench isolation orientation depicted in FIG. 7.

Figure 8:
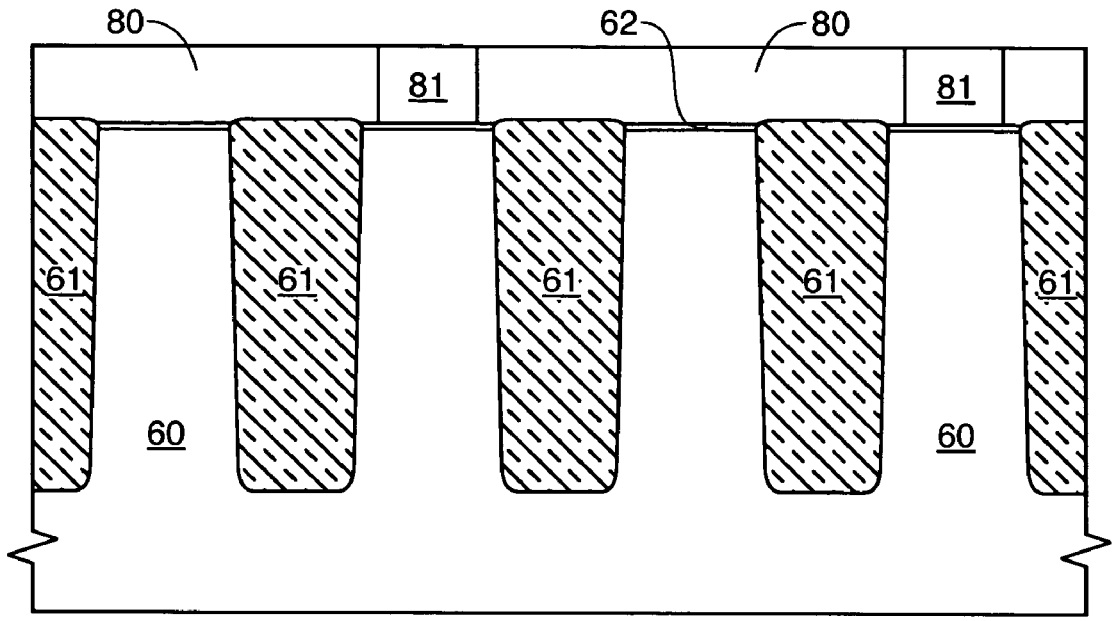
FIG. 8 is a cross-sectional view taken from FIG. 7 following the formation of a circular patterned nitride mask separated by TEOS oxide.

Referring now to FIG. 8, a tetra-ethyl-ortho-silicate (TEOS) oxide 80 is formed on the surface of silicon substrate section 60 and shallow trench isolation 61. TEOS oxide 80 is patterned with circular holes therein and filled with a masking material, such as nitride, to form a circular patterned hard mask 81.

Figure 9:
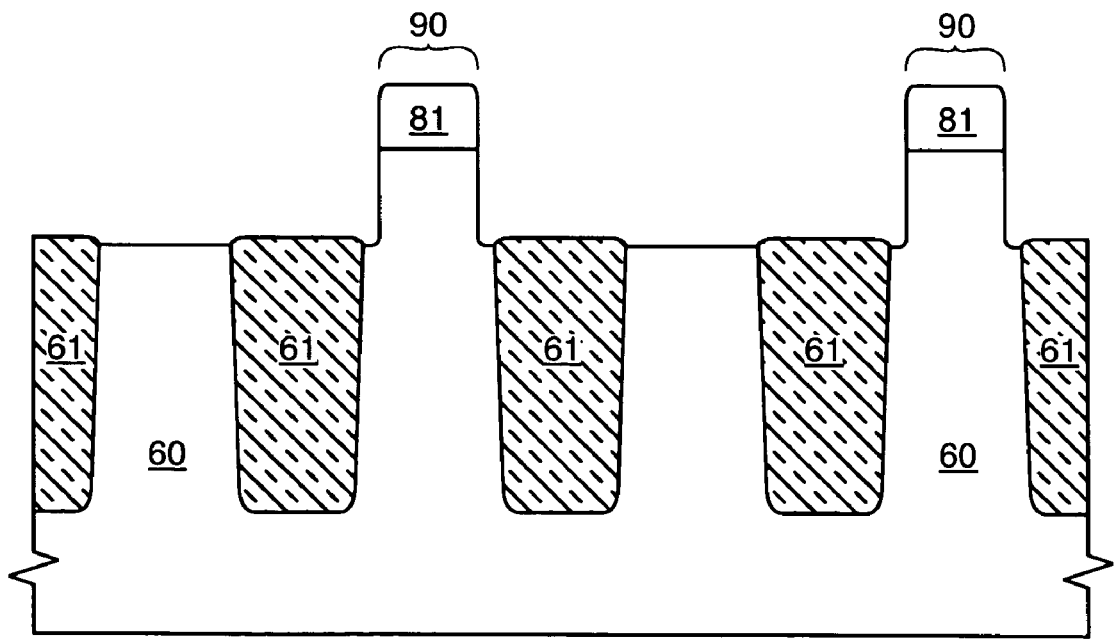
FIG. 9 is a cross-sectional view taken from FIG. 8 following a partial etch of the silicon substrate to form partial silicon pillars.

Referring now to FIG. 9 a partial etch is performed to define and partially form silicon pillars 90 while using hard mask 81. When nitride is used as the hard mask material, this etch will remove TEOS oxide 80 selective to nitride hard mask 81. A second etch is then preformed to etch STI oxide 61 and the silicon substrate 60 to form partial silicon pillars 90. The second etch defines the source region 91 of a subsequently formed vertical-surrounding-gate transistor, which is approximately one half the total length of the silicon pillars 90, the importance of which is shown later in the process.

Figure 10:
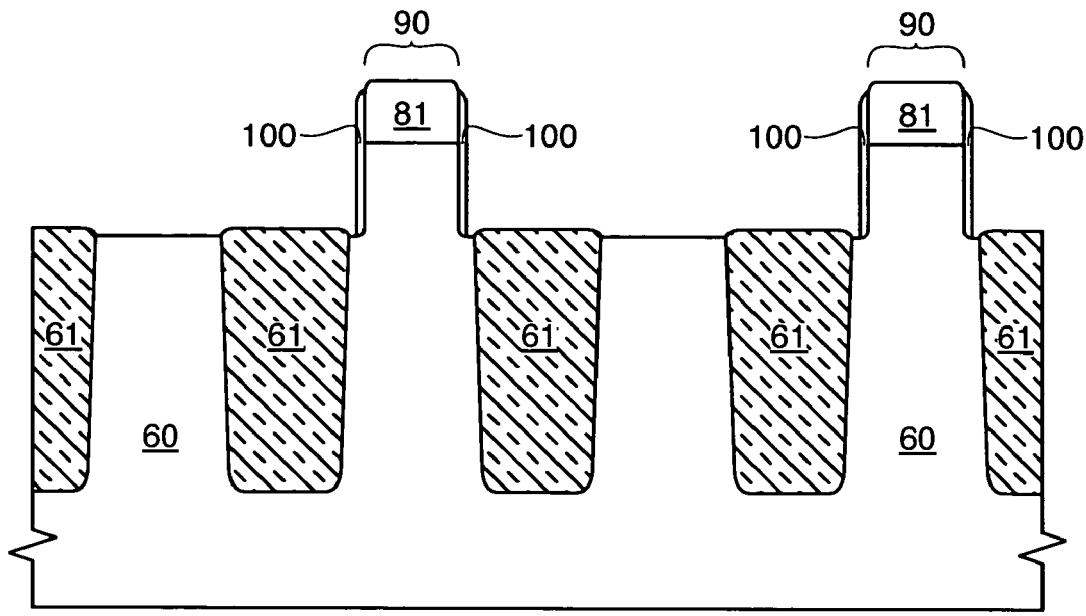
FIG. 10 is a cross-sectional view taken from FIG. 9 following the formation of nitride spacers on the partial silicon pillars.

Referring now to FIG. 10, a conformal nitride layer is deposited over the substrate assembly, followed by a nitride spacer etch that removes the nitride from the substrate assembly except along the substantially vertical sidewalls of the partial silicon pillars 90, thus forming nitride spacers 100 thereon.

Figure 11:
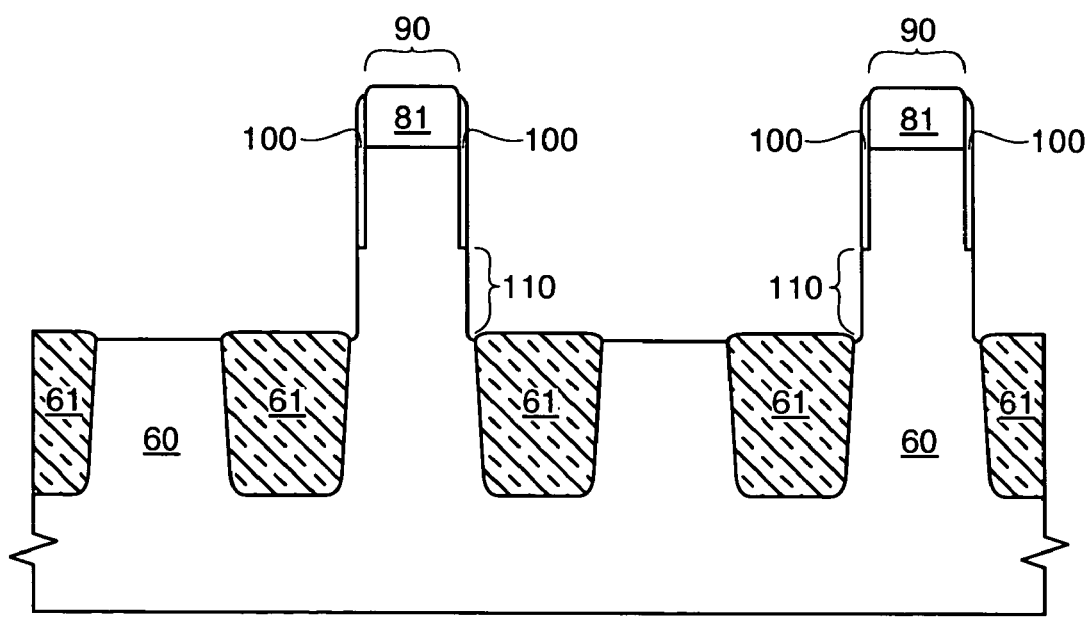
FIG. 11 is a cross-sectional view taken from FIG. 10 following an etch to define the channel length of the vertical-surrounding-gate of the transistor.

Referring now to FIG. 11, an etch is performed to define the length of the vertical-surrounding-gate of the transistor. Once again, using hard mask 81, the STI oxide 61 and the silicon substrate 60 is etched down to a desired depth starting at the base of nitride spacers 100 to increase the length of silicon pillars 90 and to establish the channel length 110 of the completed vertical-surrounding-gate transistor. Once the partial etch of the silicon pillars is performed and the nitride spacers formed thereon using the process steps described in FIGS. 9 and 10, the subsequent etch allows for an effective and reliable method to establish the desired channel length and height of the vertical-surrounding-gate transistor.

Figure 12:
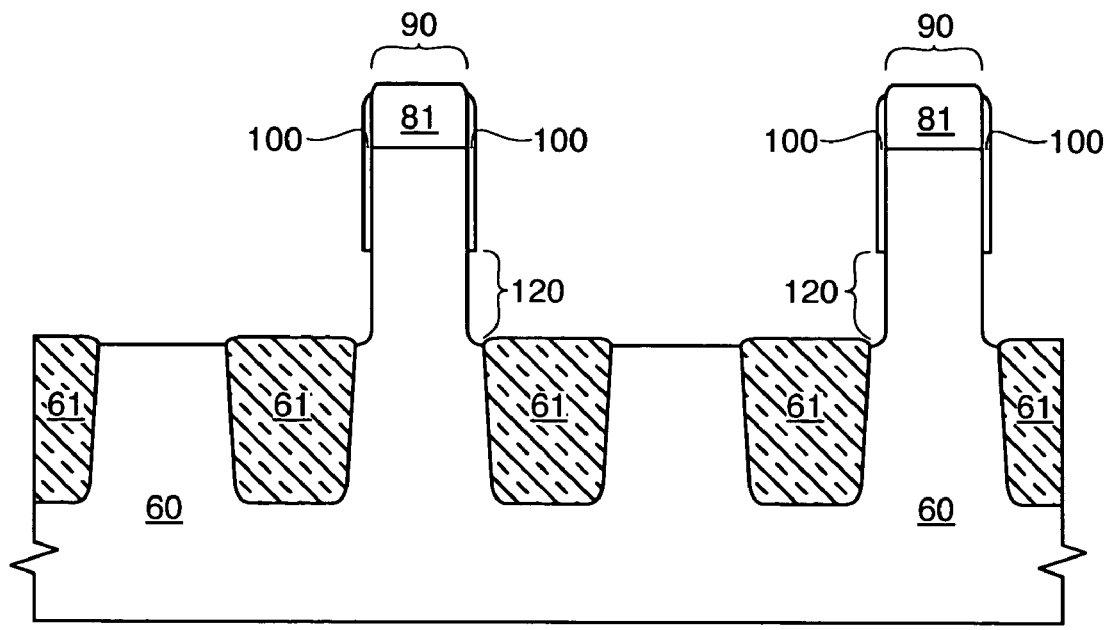
FIG. 12 is a cross-sectional view taken from FIG. 11 following an optional etch to recess into the exposed silicon of the silicon pillars.

Referring now to FIG. 12, an optional etch is performed to recess into the exposed silicon of the silicon pillars 90 below the nitride spacers 100. By using this optional etch step, the exposed portion of silicon pillars 90 is recessed horizontally approximately the width of nitride spacers 100. This option is preferred as it adds process margin when etching the final polysilicon gate as described in the process steps associated with FIG. 16.

Figure 13:
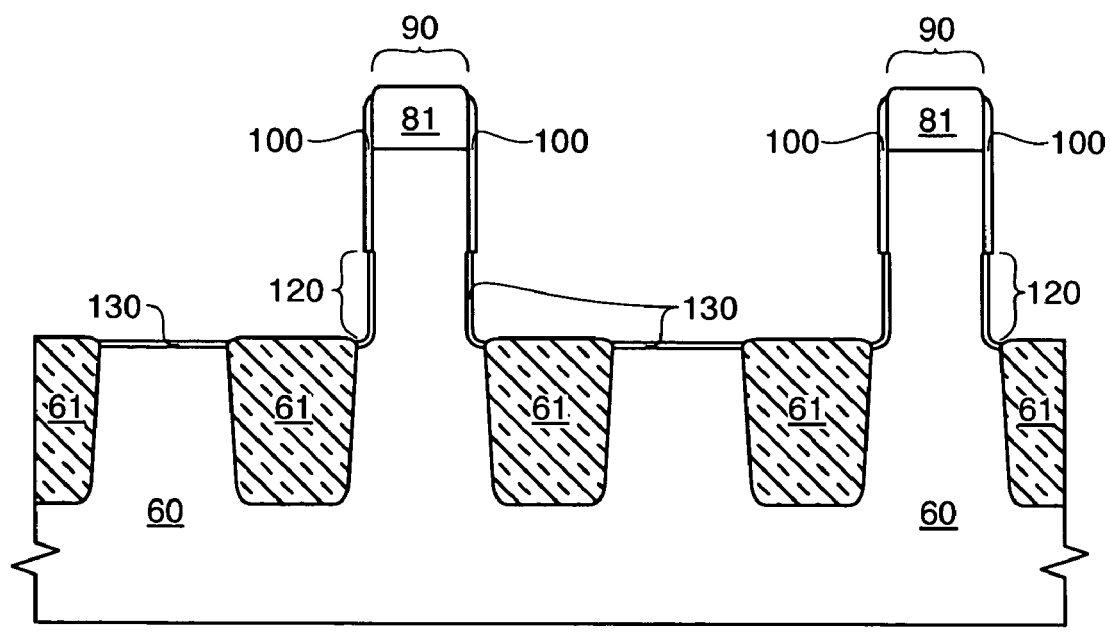
FIG. 13 is a cross-sectional view taken from FIG. 12 following the formation of a transistor gate dielectric.

Referring now to FIG. 13, a transistor gate dielectric 130, such as oxide, is formed first by either depositing a gate dielectric or by oxidizing the exposed portions of silicon pillars 90 and silicon substrate 60.

Figure 14:
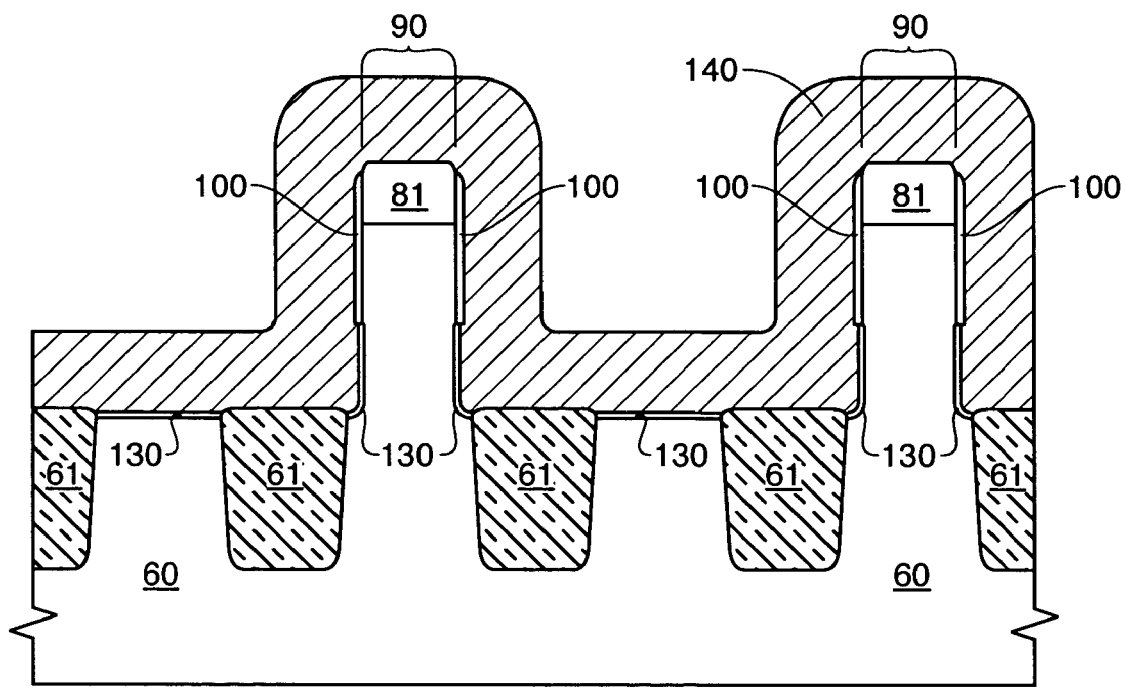
FIG. 14 is a cross-sectional view taken from FIG. 13 following the formation a conformal polysilicon material over the silicon substrate, the shallow trench isolation, the nitride spacers, the nitride capped silicon pillars and the gate dielectric.

Referring now to FIG. 14, a conformal polysilicon material 140 is deposited over the substrate assembly including, silicon substrate 60, the shallow trench isolation 61 and the nitride capped and nitride lined silicon pillars 90, and the gate dielectric 130. The conformal polysilicon material 140 will eventually become the vertical-surround-gate for each silicon pillar 90.

Figure 15:
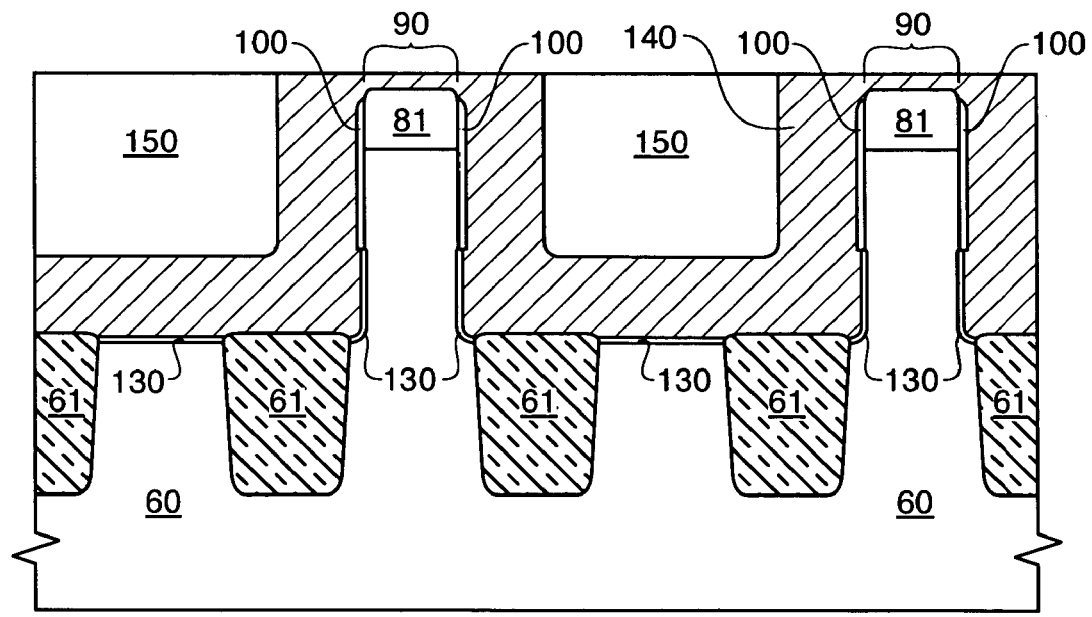
FIG. 15 is a cross-sectional view taken from FIG. 14 following the formation and planarization of silicon pillar isolation material.

Referring now to FIG. 15, a silicon pillar isolation material 150, such as the individual components of (or the combination thereof) borophosphosilicate glass (BPSG), phosphosilicate glass (PSG), or a spin on dielectric (SOD), is formed over the conformal polysilicon material 140. Next, a planarization step, such as a chemical-mechanical planarization (CMP) step, is performed to planarize the substrate assembly surface.

Figure 16:
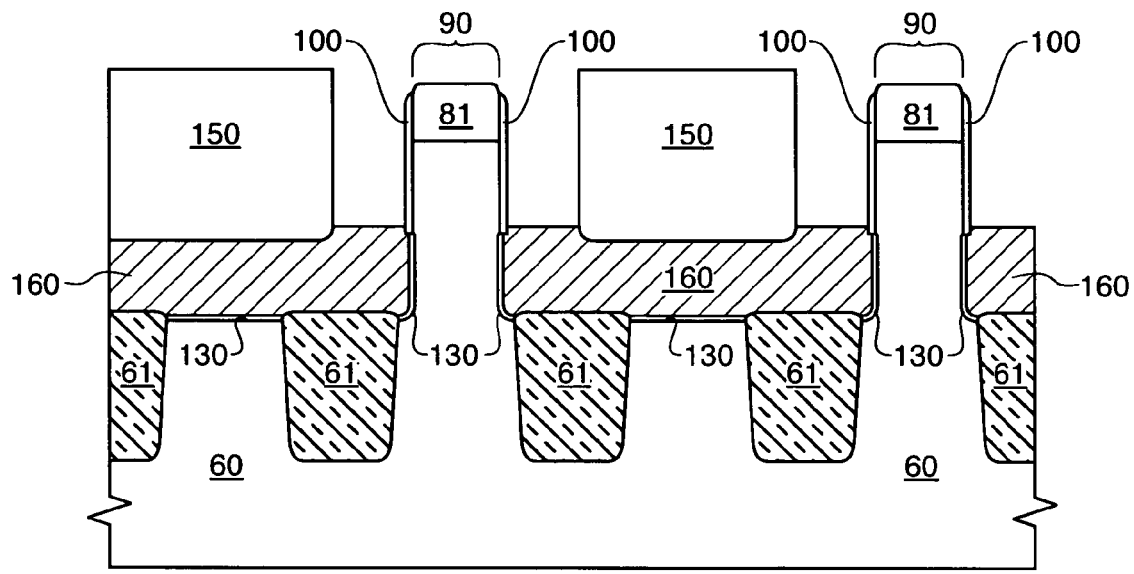
FIG. 16 is a cross-sectional view taken from FIG. 15 following the recessing of the conformal polysilicon material to form the vertical-surrounding-gate of the transistor.

Referring now to FIG. 16, an etch step is performed to recess the conformal polysilicon material 140 down to the base of the nitride spacers 100 to form the vertical-surrounding-gate 160 of the transistor. The etch may stop at the base of the nitride spacers 100, however it is not critical and it is instead preferred that should the silicon channel be recessed as described in the optional step depicted in FIG. 12, the polysilicon material 140 may be recessed below nitride spacers 100, which allows for greater etching process margin.

Figure 17:
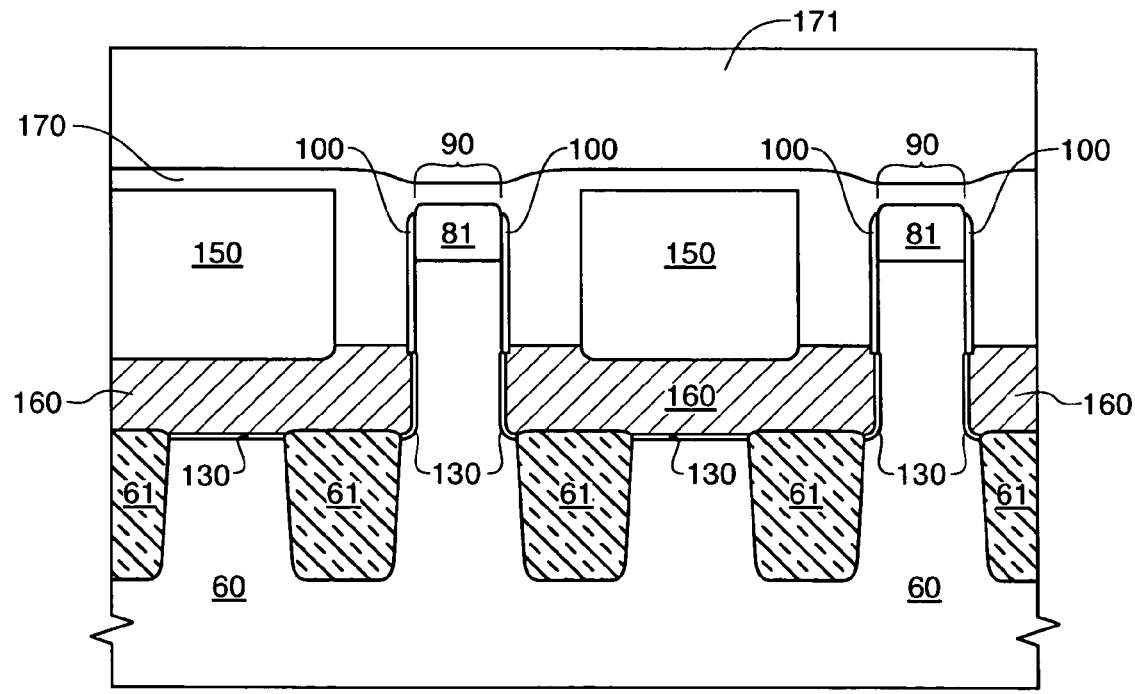
FIG. 17 is a cross-sectional view taken from FIG. 16 following an anti-reflective coating to fill the gap between the silicon pillars and the forming and patterning of an overlying photoresist.

Referring now to FIG. 17, an anti-reflective coating 170 is formed to fill the gaps between the silicon pillars 90 to protect the silicon pillars from a subsequent etch. Next, an overlying photoresist 171 is formed and patterned to define word line conductors connecting between a series (a column) of vertical-surrounding-gates 160.

Figure 18:
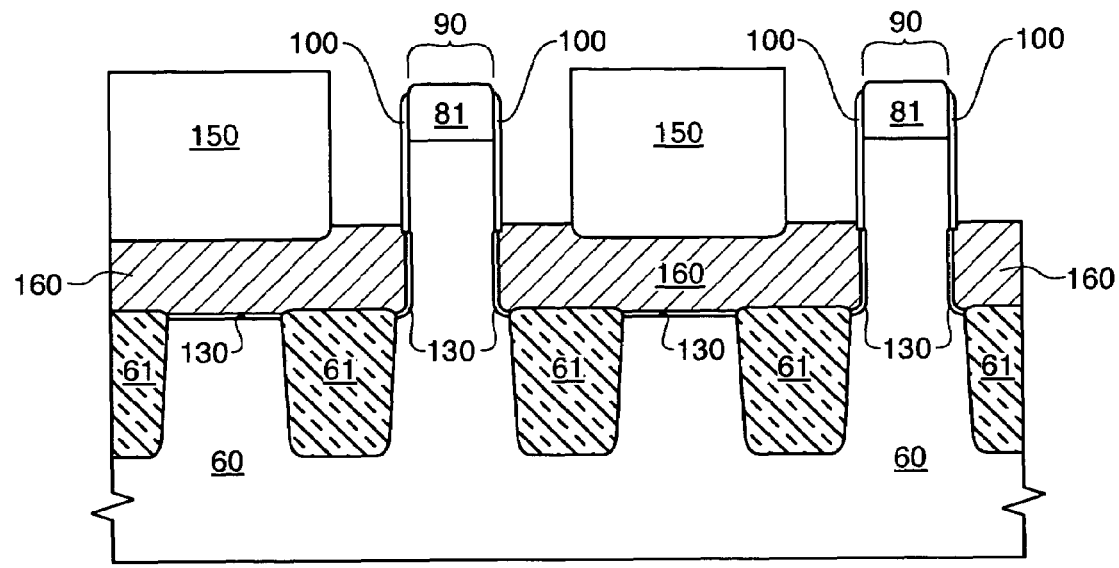
FIG. 18 is a cross-sectional view taken from FIG. 17 following an etch of the conformal polysilicon material to form word lines.

Referring now to FIG. 18, an etch is performed to form the word lines connecting to and running perpendicular to the polysilicon gate material 160. The result of the above polysilicon etches of polysilicon material 160 will finally recess the conformal polysilicon material 160 to the base of the nitride spacers 100 to form a vertical-surrounding-gate 160 of each vertical transistor structures such that the distance between an active area of the silicon pillars 90 and any portion of the recessed conformal polysilicon material 160 that may be present along the nitride spacers 100 (represented by section 192) is great enough to prevent an inversion of the active area during an active state of a vertical transistor structure and thus will not extend the length of the vertical transistor channel.

Figure 19:
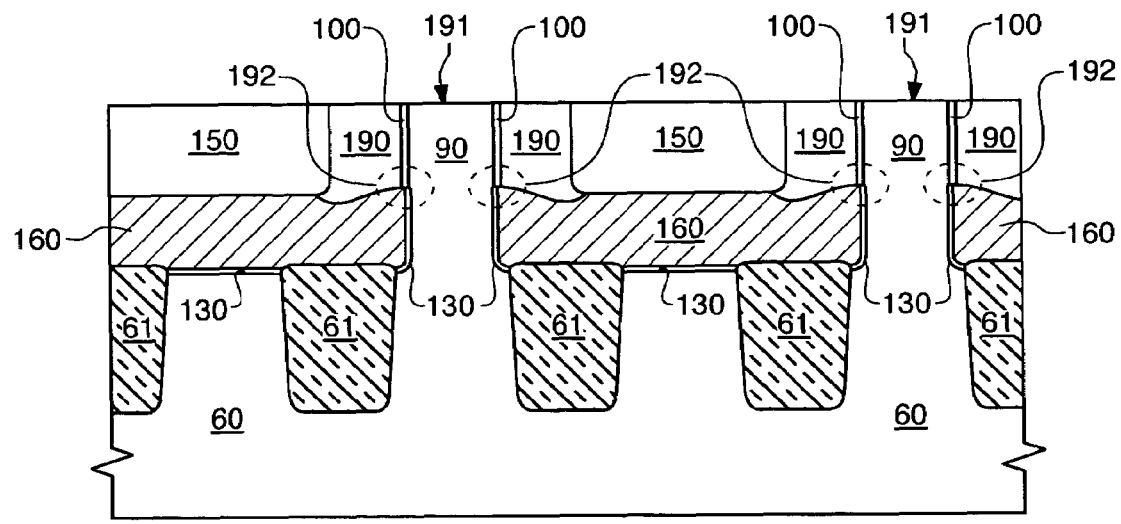
FIG. 19 is a cross-sectional view taken from FIG. 18 following the deposition of insulation material to fill the gap around the silicon pillars and a planarization etch to expose the upper surface of the silicon pillars.

Referring now to FIG. 19, a deposition of insulation material 190, such as SOD, TEOS oxide or BPSG, is performed to fill the gaps around the silicon pillars 90. Next an etch, such as by CMP or a blanket etch, is performed to expose the upper surface of the silicon pillars 90 to create a surface for a vertical-surrounding-gate source contact 191. A planarization process know to those skilled in the art is preferred in order to obtain a planar surface by removing nitride caps 81 (seen in FIG. 18) while exposing the upper portion of silicon pillars 90.

Figure 20:
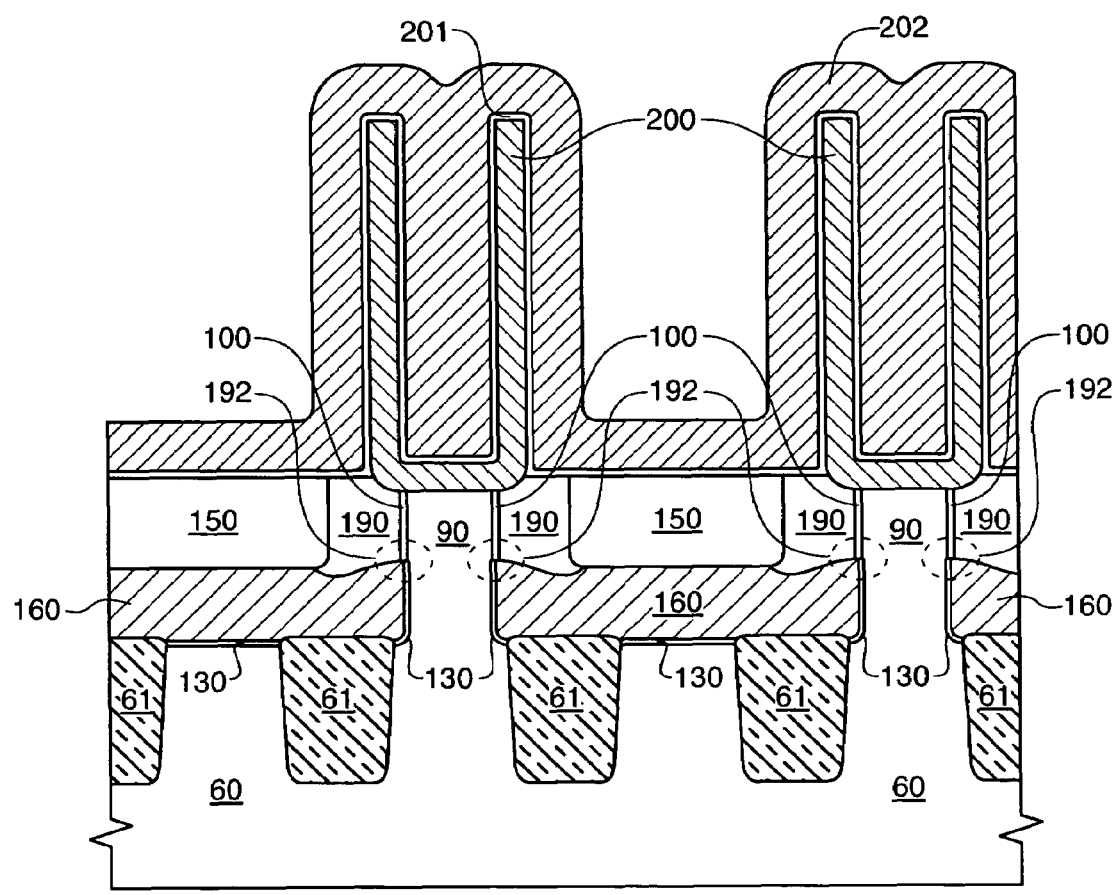
FIG. 20 is a cross-sectional view taken from FIG. 19 following the formation of container capacitors, each connecting to an underlying exposed silicon pillar.

Referring now to FIG. 20, individual container capacitor structures 200 are formed such that each lower capacitor plate connects to an underlying exposed silicon pillar 90. The container capacitors are completed by the formation of a conformal capacitor cell dielectric 201 and a polysilicon capacitor top plate 202.

Figure 21:
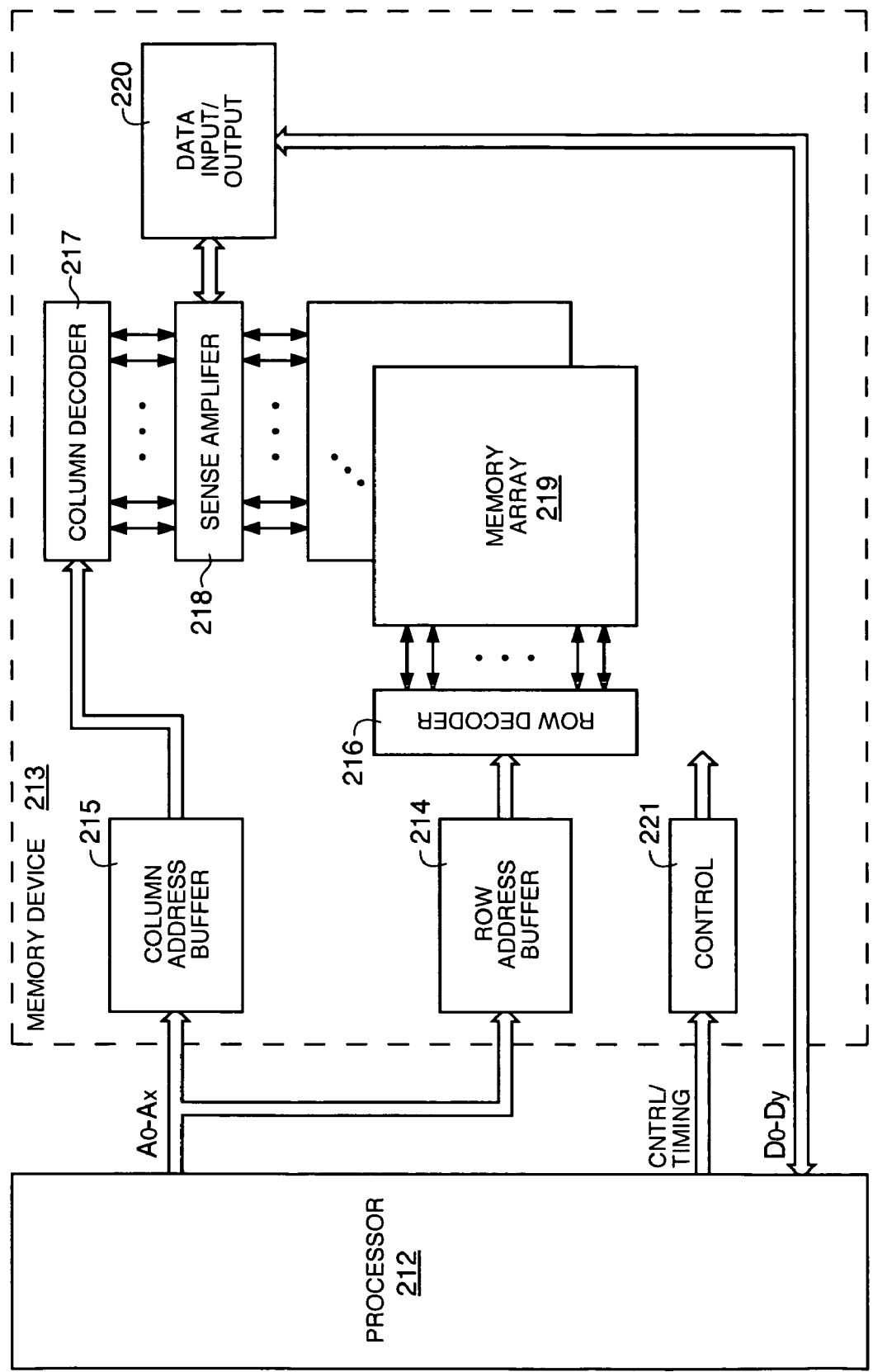
FIG. 21 is a simplified block diagram of a semiconductor system comprising a processor and memory device to which the present invention may be applied.

The vertical-surrounding-gate field effect transistors of the present invention as constructed in semiconductor devices may be applied to a semiconductor system, such as the one depicted in FIG. 21. FIG. 21 represents a general block diagram of a semiconductor system, the general operation of which is known to one skilled in the art, the semiconductor system comprising a processor 212 and a memory device 213 showing the basic sections of a memory integrated circuit, such as row and column address buffers 214 and 215, row and column decoders, 216 and 217, sense amplifiers 218, memory array 219 and data input/output 2200, which are manipulated by control/timing signals from the processor through control 221.

It is to be understood that although the present invention has been described with reference to a preferred embodiment, various modifications, known to those skilled in the art, such as utilizing the disclosed methods to form a vertical-surrounding-gate field effect transistor in any semiconductor device or semiconductor assembly, may be made to the process steps presented herein without departing from the invention as recited in the several claims appended hereto.

What is claimed is:

1. A method of forming a semiconductor assembly having vertical transistor structures comprising:

forming columns of trench isolation material in a silicon substrate;

forming circular patterned hard mask material in circular holes in an insulation material overlying the silicon substrate;

forming partial silicon pillars by removing an upper portion of the silicon substrate while using the hard mask material as an etching mask;

forming nitride spacers on sidewalls of the partial silicon pillars;

with the hard mask material in place, etching the trench isolation material and the silicon substrate to a desired depth to form silicon pillars, each having a defined channel length determined by extending the partial silicon pillars in a vertical direction below the nitride spacers;

forming a gate dielectric on an exposed portion of the silicon pillars below the nitride spacers;

depositing a conformal polysilicon material over the silicon substrate, the trench isolation material, the hard mask material, the nitride spacers and the transistor gate dielectric;

forming a silicon pillar isolation material over the conformal polysilicon material;

planarizing the conformal polysilicon material and the silicon pillar isolation material;

recessing the conformal polysilicon material down to a base of the nitride spacers to form a vertical-surrounding-gate of the vertical transistor structures;

forming an anti-reflective coating over the conformal polysilicon material and silicon pillar isolation material;

forming conductors to connect to a series of vertical-surrounding-gates;

depositing an insulation material over the polysilicon material and silicon pillar isolation material; and removing the hard mask material to create a surface for a vertical-surrounding-gate source contact.

2. The method of claim 1, wherein the insulation material is a tetra-ethyl-ortho-silicate (TEOS) oxide.

3. The method of claim 1, wherein the circular patterned hard mask material is nitride.

4. The method of claim 1, wherein the forming of the partial silicon pillars comprises an etch that defines approximately one half the total length of the silicon pillars.

5. The method of claim 1, further comprising etching a horizontal component of the exposed portions of the silicon pillars below the nitride spacers to approximately the width of the nitride spacers.

6. The method of claim 1, wherein the silicon pillar isolation material is a material selected from the group consisting essentially of borophosphosilicate glass (BPSG), phosphosilicate glass (PSG), or a spin on dielectric (SOD).

7. The method of claim 1, wherein the planarizing the conformal polysilicon material and the silicon pillar isolation material comprises chemical-mechanical planarization (CMP).

8. The method of claim 1, wherein the recessing of the conformal polysilicon material continues below the base of the nitride spacers.

9. The method of claim 1, wherein the insulation material to fill any gaps around the silicon pillars is a material selected from the group consisting essentially of borophosphosilicate glass (BPSG), phosphosilicate glass (PSG), or a spin on dielectric (SOD).

10. The method of claim 1, wherein exposing the upper surface of the silicon pillars to create a surface for a vertical-surrounding-gate source contact comprises chemical-mechanical planarization (CMP).

11. A method of forming vertical transistor structures for a semiconductor assembly comprising:

forming columns of trench isolation material in a silicon substrate;

forming circular patterned hard mask material in circular holes in an insulation material overlying the silicon substrate;

forming partial silicon pillars by removing an upper portion of the silicon substrate while using the hard mask material as an etching mask;

forming nitride spacers on sidewalls of the partial silicon pillars;

with the hard mask material in place, etching the trench isolation material and the silicon substrate to a desired depth to form silicon pillars, each having a defined channel length determined by extending the partial silicon pillars in a vertical direction below the nitride spacers;

etching a horizontal component of exposed portions of the silicon pillars below the nitride spacers to approximately the width of nitride spacers;

forming a gate dielectric on an exposed portion of the silicon pillars below the nitride spacers;

depositing a conformal polysilicon material over the silicon substrate, the trench isolation material, the hard mask material, the nitride spacers and the transistor gate dielectric;

forming a silicon pillar isolation material over the conformal polysilicon material;

planarizing the conformal polysilicon material and the silicon pillar isolation material;

recessing the conformal polysilicon material down to a base of the nitride spacers to form a vertical-surrounding-gate of the vertical transistor structures;

forming an anti-reflective coating over the conformal polysilicon material and silicon pillar isolation material;

forming conductors to connect to a series of vertical-surrounding-gates;

etching the polysilicon material to form the conductors from the polysilicon gate material;

depositing an insulation material to fill any gaps around the silicon pillars; and exposing an upper surface of the silicon pillars to create a surface for a vertical-surrounding-gate source contact.

12. The method of claim 11, wherein the insulation material is a tetra-ethyl-ortho-silicate (TEOS) oxide.

13. The method of claim 11, wherein the circular patterned hard mask material is nitride.

14. The method of claim 11, wherein the forming of the partial silicon pillars comprises an etch that defines approximately one half the total length of the silicon pillars.

15. The method of claim 11, wherein the silicon pillar isolation material is a material selected from the group consisting essentially of borophosphosilicate glass (BPSG), phosphosilicate glass (PSG), or a spin on dielectric (SOD).

16. The method of claim 11, wherein the planarizing the conformal polysilicon material and the silicon pillar isolation material comprises chemical-mechanical planarization (CMP).

17. The method of claim 11, wherein the recessing of the conformal polysilicon material continues below the base of the nitride spacers.

18. The method of claim 11, wherein the insulation material to fill any gaps around the silicon pillars is a material selected from the group consisting essentially of borophosphosilicate glass (BPSG), phosphosilicate glass (PSG), or a spin on dielectric (SOD).

19. The method of claim 11, wherein exposing the upper surface of the silicon pillars to create a surface for a vertical-surrounding-gate source contact comprises chemical-mechanical planarization (CMP).

20. A method of forming a semiconductor assembly having memory cells with vertical transistor structures comprising:

forming columns of trench isolation material in a silicon substrate;

forming circular patterned hard mask material in circular holes in an insulation material overlying the silicon substrate;

forming partial silicon pillars by removing an upper portion of the silicon substrate while using the hard mask material as an etching mask;

forming nitride spacers on sidewalls of the partial silicon pillars;

with the hard mask material in place, etching the trench isolation material and the silicon substrate to a desired depth to form silicon pillars, each having a defined channel length determined by extending the partial silicon pillars in a vertical direction below the nitride spacers;

forming a gate dielectric on an exposed portion of the silicon pillars below the nitride spacers;

depositing a conformal polysilicon material over the silicon substrate, the trench isolation material, the hard mask material, the nitride spacers and the transistor gate dielectric;

forming a silicon pillar isolation material over the conformal polysilicon material;

planarizing the conformal polysilicon material and the silicon pillar isolation material;

recessing the conformal polysilicon material down to a base of the nitride spacers to form a vertical-surrounding-gate of the vertical transistor structures;

forming an anti-reflective coating over the conformal polysilicon material and silicon pillar isolation material;

forming conductors to connect to a series of vertical-surrounding-gates;

depositing an insulation material over the conformal polysilicon material and silicon pillar isolation material;

exposing an upper surface of the silicon pillars to create a surface for a vertical-surrounding-gate source contact; and forming a capacitor structure connecting the silicon pillars at the vertical-surrounding-gate source contact.

21. The method of claim 20, wherein the insulation material is a tetra-ethyl-ortho-silicate (TEOS) oxide.

22. The method of claim 20, wherein the circular patterned hard mask material is nitride.

23. The method of claim 20, wherein the forming of the partial silicon pillars comprises an etch that defines approximately one half the total length of the silicon pillars.

24. The method of claim 20, further comprising etching a horizontal component of the exposed portions of the silicon pillars below the nitride spacers to approximately the width of the nitride spacers.

25. The method of claim 20, wherein the silicon pillar isolation material is a material selected from the group consisting essentially of borophosphosilicate glass (BPSG), phosphosilicate glass (PSG), or a spin on dielectric (SOD).

26. The method of claim 20, wherein the planarizing the conformal polysilicon material and the silicon pillar isolation material comprises chemical-mechanical planarization (CMP).

27. The method of claim 20, wherein the recessing of the conformal polysilicon material continues below the base of the nitrides spacers.

28. The method of claim 20, wherein the insulation material to fill any gaps around the silicon pillars is a material selected from the group consisting essentially of borophosphosilicate glass (BPSG), phosphosilicate glass (PSG), or a spin on dielectric (SOD).

29. The method of claim 20, wherein exposing the upper surface of the silicon pillars to create a surface for a vertical-surrounding-gate source contact comprises chemical-mechanical planarization (CMP).

30. A method of forming a semiconductor assembly having vertical transistor structures comprising:
forming partial silicon pillars by etching into a silicon substrate having isolation regions therein, to define a vertical transistor source for each vertical transistor structure;
forming nitride spacers on sidewalls of each vertical transistor source;
extending the overall length of the silicon pillars by etching further into the silicon substrate to a desired depth below the nitride spacers, the extended length of the silicon pillars defining a vertical transistor channel length for each vertical transistor structure;
forming a gate dielectric on the extended length of the silicon pillars below the nitride spacers;
depositing a conformal polysilicon material over the silicon substrate, the nitride spacers and the transistor gate dielectric;
forming a silicon pillar isolation material over the conformal polysilicon material;
etching the conformal polysilicon material and the silicon pillar isolation material to a base of the nitride spacers;
recessing the conformal polysilicon material to the base of the nitride spacers to form a vertical-surrounding-gate of the vertical transistor structures such that the distance between an active area of the silicon pillars and any portion of the recessed conformal polysilicon material that may reside along the nitride spacers is great enough to prevent an extension of the vertical transistor channel length of each vertical transistor structure.

31. The method of claim 30, wherein the etching of the partial silicon pillars comprises an etch that defines approximately one half the total length of the silicon pillars.

32. The method of claim 30, further comprising etching a horizontal component of the exposed portions of the silicon pillars below the nitride spacers to approximately the width of the nitride spacers.

33. The method of claim 30, wherein the silicon pillar isolation material is a material selected from the group consisting essentially of borophosphosilicate glass (BPSG), phosphosilicate glass (PSG), or a spin on dielectric (SOD).

34. The method of claim 30, wherein the etching the conformal polysilicon material and the silicon pillar isolation material comprises chemical-mechanical planarization (CMP).

35. The method of claim 30, wherein the recessing of the conformal polysilicon material continues below the base of the nitride spacers.

36. A method of forming a semiconductor assembly with vertical transistor structures comprising:
forming partial silicon pillars by etching into a silicon substrate having isolation regions therein, to define a vertical transistor source for each vertical transistor structure;
forming nitride spacers on sidewalls of each vertical transistor source;
extending the overall length of the silicon pillars by etching further into the silicon substrate to a desired depth below the nitride spacers, the extended length of the silicon pillars defining a vertical transistor channel length for each vertical transistor structure;
forming a gate dielectric on the extended length of the silicon pillars below the nitride spacers;
depositing a conformal polysilicon material over the silicon substrate, the nitride spacers and the transistor gate dielectric;
forming a silicon pillar isolation material over the conformal polysilicon material;
etching the conformal polysilicon material and the silicon pillar isolation material to a base of the nitride spacers;
recessing the conformal polysilicon material to the base of the nitride spacers to form a vertical-surrounding-gate of the vertical transistor structures;
wherein the distance between an active area of the silicon pillars and any portion of the recessed conformal polysilicon material present along the nitride spacers is great enough to prevent an inversion of the active area during an active state of a vertical transistor structure.

37. The method of claim 36, wherein the etching of the partial silicon pillars comprises an etch that defines approximately one half the total length of the silicon pillars.

38. The method of claim 36, further comprising etching a horizontal component of the exposed portions of the silicon pillars below the nitride spacers to approximately the width of the nitride spacers.

39. The method of claim 36, wherein the silicon pillar isolation material is a material selected from the group consisting essentially of borophosphosilicate glass (BPSG), phosphosilicate glass (PSG), or a spin on dielectric (SOD).

40. The method of claim 36, wherein the etching the conformal polysilicon material and the silicon pillar isolation material comprises chemical-mechanical planarization (CMP).

41. The method of claim 36, wherein the recessing of the conformal polysilicon material continues below the base of the nitride spacers.

42. A method of forming a semiconductor assembly having memory cells with vertical transistor structures comprising:
forming partial silicon pillars by etching into a silicon substrate having isolation regions therein, to define a vertical transistor source for each vertical transistor structure;
forming nitride spacers on sidewalls of each vertical transistor source;
extending the overall length of the silicon pillars by etching further into the silicon substrate to a desired depth below the nitride spacers, the extended length of the silicon pillars defining a vertical transistor channel length for each vertical transistor structure;
forming a gate dielectric on the extended length of the silicon pillars below the nitride spacers;
depositing a conformal polysilicon material over the silicon substrate, the nitride spacers and the transistor gate dielectric;
forming a silicon pillar isolation material over the conformal polysilicon material;
etching the conformal polysilicon material and the silicon pillar isolation material to a base of the nitride spacers;
recessing the conformal polysilicon material to the base of the nitride spacers to form a vertical-surrounding-gate of the vertical transistor structures such that the distance between an active area of the silicon pillars and any portion of the recessed conformal polysilicon material present along the nitride spacers is great enough to prevent an inversion of the active area during an active state of a vertical transistor structure;

forming an anti-reflective coating over the conformal polysilicon material and silicon pillar isolation material;

forming conductors to connect to a series of vertical-surrounding-gates;

depositing an insulation material around the silicon pillars;

exposing an upper surface of the silicon pillars to create a surface for a vertical-surrounding-gate source contact; and forming a capacitor structure connecting the silicon pillars at the vertical-surrounding-gate source contact.

43. The method of claim 42, wherein the etching of the partial silicon pillars comprises an etch that defines approximately one half the total length of the silicon pillars.

44. The method of claim 42, further comprising etching a horizontal component of the exposed portions of the silicon pillars below the nitride spacers to approximately the width of the nitride spacers.

45. The method of claim 42, wherein the silicon pillar isolation material is a material selected from the group consisting essentially of borophosphosilicate glass (BPSG), phosphosilicate glass (PSG), or a spin on dielectric (SOD).

46. The method of claim 42, wherein the etching the conformal polysilicon material and the silicon pillar isolation material comprises chemical-mechanical planarization (CMP).

47. The method of claim 42, wherein the recessing of the conformal polysilicon material continues below the base of the nitride spacers.

* * * * *